(12) United States Patent
Swenson et al.

(10) Patent No.: US 7,060,989 B2
(45) Date of Patent: Jun. 13, 2006

(54) METHOD AND APPARATUS FOR IMPROVED PROCESSING WITH A GAS-CLUSTER ION BEAM

(75) Inventors: David R. Swenson, Georgetown, MA (US); John J. Hautala, Beverly, MA (US); Michael E. Mack, Manchester, MA (US); Martin D. Tabat, Nashua, NH (US); Matthew C. Gwinn, Winchendon, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 11/084,632

(22) Filed: Mar. 18, 2005

(65) Prior Publication Data

US 2005/0205802 A1 Sep. 22, 2005

Related U.S. Application Data

(60) Provisional application No. 60/554,812, filed on Mar. 19, 2004.

(51) Int. Cl.
*H01J 27/00* (2006.01)

(52) U.S. Cl. .................. 250/423 R; 250/424

(58) Field of Classification Search ............ 250/423 R, 250/424
See application file for complete search history.

(56) References Cited

U.S. PATENT DOCUMENTS

| 3,944,399 | A | 3/1976 | Gspann .................... 55/17 |
| 5,729,028 | A | 3/1998 | Rose .................... 250/492.21 |
| 5,814,194 | A | 9/1998 | Deguchi et al. ......... 204/192.1 |
| 6,331,227 | B1 * | 12/2001 | Dykstra et al. ......... 156/345.29 |
| 6,375,790 | B1 | 4/2002 | Fenner .................... 156/345 |

OTHER PUBLICATIONS

Ames, F. et al. Acceleration of clusters, collision induced charge exchange at MeV energies and applications for materials science. Nucl. Instrum. Methods B 112, p. 64-67 (1996).

(Continued)

*Primary Examiner*—Kiet T. Nguyen
(74) *Attorney, Agent, or Firm*—Jerry Cohen; John A. Hamilton

(57) ABSTRACT

Apparatus and methods for improving processing of workpieces with gas-cluster ion beams and modifying the gas-cluster ion energy distribution in the GCIB. In a reduced-pressure environment, generating an energetic gas-cluster ion beam and subjecting the beam to increased pressure region.

23 Claims, 7 Drawing Sheets

OTHER PUBLICATIONS

Li, Z. et al. Survival of weakly bound quantum clusters in collisions with atoms. Chem. Phys. Lett. 229, pp. 650-656 (1994).

Bergen, T. et al. Multiply charged cluster ion crossed-beam apparatus: Multi-ionization of clusters by ion impact. Rev. Sci. Instrum. 70(8), pp. 3244-3253 (1999).

Knospe, O. et al. Charge transfer in cluster-atom collisions. Eur. Phys. J. D 5, pp. 1-4 (1999).

Farizon, B. et al. Multifragmentation after multi-ionization of hydrogen clusters in high energy cluster-atom and cluster-cluster collisions. Int. J. Mass Spect. 192, pp. 259-266 (1999).

Ichihashi, M. et al. Low energy cluster ion-atom collision: Quantum mechanical molecular dynamics simulation of $Ar_n^+$ + Ar. J. Chem. Phys. 105(18), pp. 8164-8169 (1996).

Saalmann, U. et al. Excitation and Relaxation in Atom-Cluster Collisions. Phys. Rev. Lett. 80(15), pp. 3213-3216 (1998).

Wohrer, K. et al. Swift cluster-atom collisions: a progress report. Nucl. Instrum. Methods B 146, pp. 29-38 (1998).

* cited by examiner

US 7,060,989 B2

METHOD AND APPARATUS FOR IMPROVED PROCESSING WITH A GAS-CLUSTER ION BEAM

CROSS-REFERENCE TO RELATED APPLICATIONS

This application claims the benefit of priority from U.S. Provisional Application Ser. No. 60/554,812 filed 19 Mar. 2004 and entitled "Method and Apparatus for Improved Processing With a Gas-Cluster Ion Beam," the contents of which are incorporated herein by reference in their entirety.

FIELD OF THE INVENTION

This invention relates generally to methods and apparatus for processing surfaces with a gas-cluster ion beam and, more particularly, to methods and apparatus for modifying characteristics of a gas-cluster ion beam to achieve improved surface processing results.

BACKGROUND OF THE INVENTION

The use of a cluster ion beam for processing surfaces is known (see for example, U.S. Pat. No. 5,814,194, Deguchi et al.) in the art. As the term is used herein, gas-clusters refer to nano-sized aggregates of materials that are gaseous under conditions of standard temperature and pressure. Such gas-clusters are typically comprised of aggregates of from a few to several thousand molecules loosely bound to form the cluster. The clusters can be ionized by electron bombardment or other means, permitting them to be formed into directed beams of controllable energy. Such ions each typically carry positive charges of q·e (where e is the electronic charge and q is an integer of from one to several representing the charge state of the cluster ion). Non-ionized clusters may also exist within a cluster ion beam. The larger sized cluster ions are often the most useful because of their ability to carry substantial energy per cluster ion, while yet having only modest energy per molecule. The clusters disintegrate on impact, with each individual molecule carrying only a small fraction of the total cluster ion energy. Consequently, the impact effects of large cluster ions are substantial, but are limited to a very shallow surface region. This makes cluster ions effective for a variety of surface modification processes, without the tendency to produce deeper subsurface damage characteristic of conventional monomer ion beam processing.

Means for creation of and acceleration of such GCIBs are described in the reference (U.S. Pat. No. 5,814,194) previously cited, the contents of which are incorporated by reference as though set out at length herein. Presently available cluster ion sources produce clusters ions having a wide distribution of sizes, N (where N=the number of molecules in each cluster ion—in the case of monatomic gases like argon, an atom of the monatomic gas will be referred to as a molecule and an ionized atom of such a monatomic gas will be referred to herein as a molecular ion or simply a monomer ion.)

Many useful surface processing effects can be achieved by bombarding surfaces with GCIBs. These processing effects include, but are not necessarily limited to, cleaning, smoothing, etching, doping, and film formation or growth. In many cases, it is found that in order to achieve industrially practical throughputs with GCIB processing, GCIB currents on the order of hundreds to thousands of microamps are required. Efforts to increase the intensity and ionization of a GCIB beam tend to produce additional higher charge state clusters (q>1). When ionization is performed by electron bombardment, ionization is produced by random electron impacts. In order to produce a high ratio of ionized to non-ionized clusters, the electron impact probability must be high and the resulting charge state distribution follows approximately Poisson statistics, with the approximate probability, P(q), of charge state q given by:

$$P(q) = \frac{\bar{q}^q}{q!} e^{-\bar{q}} i. \quad \text{(Eqn. 1)}$$

where $\bar{q}$ is the average ionized cluster charge state after leaving the ionizer. Thus, an ionized cluster beam with a highly ionized fraction will also include multiply-charged cluster ions in the beam. For example, theoretically the average cluster charge state of a GCIB beam where 95% of the clusters are ionized would be 3, with more than 8% of the beam in charge states 6 and higher. However, such highly charged clusters can fragment, or undergo charge exchange reactions, or partially evaporate, resulting in a different charge state distribution and/or a different energy distribution, and so in a practical beam, the precise charge state and energy distributions are not readily predicted.

In the prior art, it has been understood that optimal ion beam propagation is generally achieved under low-pressure conditions. It has also been understood that the moderate to high intensity GCIBs, as are normally required for efficient surface processing of materials on an industrially economic scale, transport substantial quantities of gas in the form of gas-cluster ions to the target region. When gas-cluster ions in a GCIB reach the target, the clusters disintegrate and the GCIB-transported mass is released as molecular gas. The entire gas load of the beam is released when the GCIB strikes the target region. For an argon beam having a beam current, $I_B$, the gas flow, F (sccm), transmitted in the beam is:

$$F = 2.23 \times 10^{-18} \left(\frac{N}{q}\right)\left(\frac{I_B}{e}\right) \quad \text{(Eqn. 2)}$$

Accordingly, for a beam current of only 400 µA and an N/q ratio of 5000, the beam transmits a substantial gas flow of about 27 sccm. In a typical GCIB processing tool, multiple large capacity vacuum pumps are employed in order to maintain a low-pressure environment in the face of this gas load.

Because high intensity GCIBs contain clusters of various charge states, acceleration of such beams by applying an accelerating potential, $V_{Acc}$, of a few kV results in beams having clusters of multiple energies, $q \cdot V_{Acc}$ for all values of q present in the beam. In general, it has been learned that many of the beneficial processing effects that can be obtained by the use of GCIB for processing workpiece surfaces are dependent on the energies of the gas-cluster ions in the beam. Etching of a surface, for example, generally proceeds faster by using higher energy clusters. Another valuable application of GCIB processing is the smoothing of surfaces, and GCIB has been shown to be in some cases superior to other methods for smoothing surfaces at the atomic or near-atomic scale. Although for some beam conditions GCIB processing of a surface can produce exceptional smoothness, it has been observed that GCIB processing does not always smooth a surface. In fact, when the starting surface is relatively smooth, GCIB processing may, in some circumstances, roughen the surface. Often it is desirable to both etch and smooth a surface. When using conventional techniques to optimize processing conditions (for example, by selecting cluster source gas material, by selecting acceleration potential, by selecting a GCIB current, and/or by selecting a GCIB processing dose) it has been found that frequently there is not a GCIB beam condition that gives an adequate etching rate while simultaneously smoothing, or at least not roughening, an already smooth surface. It has been found that an aggressive etch rate by GCIB processing commonly requires high energy, high intensity GCIB conditions, while freedom from roughening and surface smoothing are best obtained with low energy beams (or with conditions that are otherwise not practical for etching). In such cases it has been necessary to use a combination of several GCIB steps to achieve a result approaching a desired objective. Such a process would involve first an aggressive etch with a first set of beam conditions, followed by a second less aggressive etch using a second set of beam conditions to reduce the roughening caused by the first etch, and then yet another step that applies a beam condition that smoothes without any significant etching. Such combinations of steps or even more complex combinations are known in the art and result in complex processing recipes with low throughputs for certain important processes, while sometimes still not achieving desired final results. U.S. Pat. No. 6,375,790 to Fenner, for example, teaches a GCIB processing apparatus adapted for multi-step processing of substrates capable of such complex processing recipes.

It is the case that the available ionizers for producing ionized gas-clusters for GCIB formation inherently produce beams with a wide range of ionization states, and particularly including multi-ionized gas-clusters when operated at conditions that produce intense beams (see Eqn. 1 above) needed for high throughput GCIB processing of workpieces. When such beams are accelerated with potentials adequate to give energies that provide good etching rates, they tend to produce less-than-desirable surface smoothing and may even produce surface roughening. This problem can be at least partially alleviated by complex or multi-step GCIB processing recipes that reduce processing throughput below desirable rates. However, sometimes even complex processing recipes with several different beam conditions do not produce the desired ultimate level smoothness needed for some important processes.

SUMMARY OF THE INVENTION

In light of the deficiencies described above, it is an objective of this invention to provide a method of modifying GCIB characteristics to form a beam that has good smoothing capabilities and yet retains good etching capabilities.

It is another objective of this invention to provide a method of modifying GCIB characteristics to form a beam that has improved surface smoothing capabilities.

It is a further objective of this invention to provide an apparatus for modifying characteristics of a GCIB for workpiece processing such that the apparatus produces a GCIB capable simultaneously capable of high etching rate and good ultimate workpiece smoothness.

It is a still further objective of this invention to provide an apparatus for modifying characteristics of a GCIB for workpiece processing such that the apparatus produces a GCIB that has improved surface smoothing capabilities.

These and other objectives are achieved in the present invention through controlled variations in the environmental pressures and geometries employed during the formation of the GCIB.

BRIEF DESCRIPTION OF THE FIGURES

For a better understanding of the present invention, together with other and further objects thereof, reference is made to the accompanying figures and detailed description, wherein.

DETAILED DESCRIPTION OF PREFERRED EMBODIMENTS OF THE INVENTION

Figure 1:
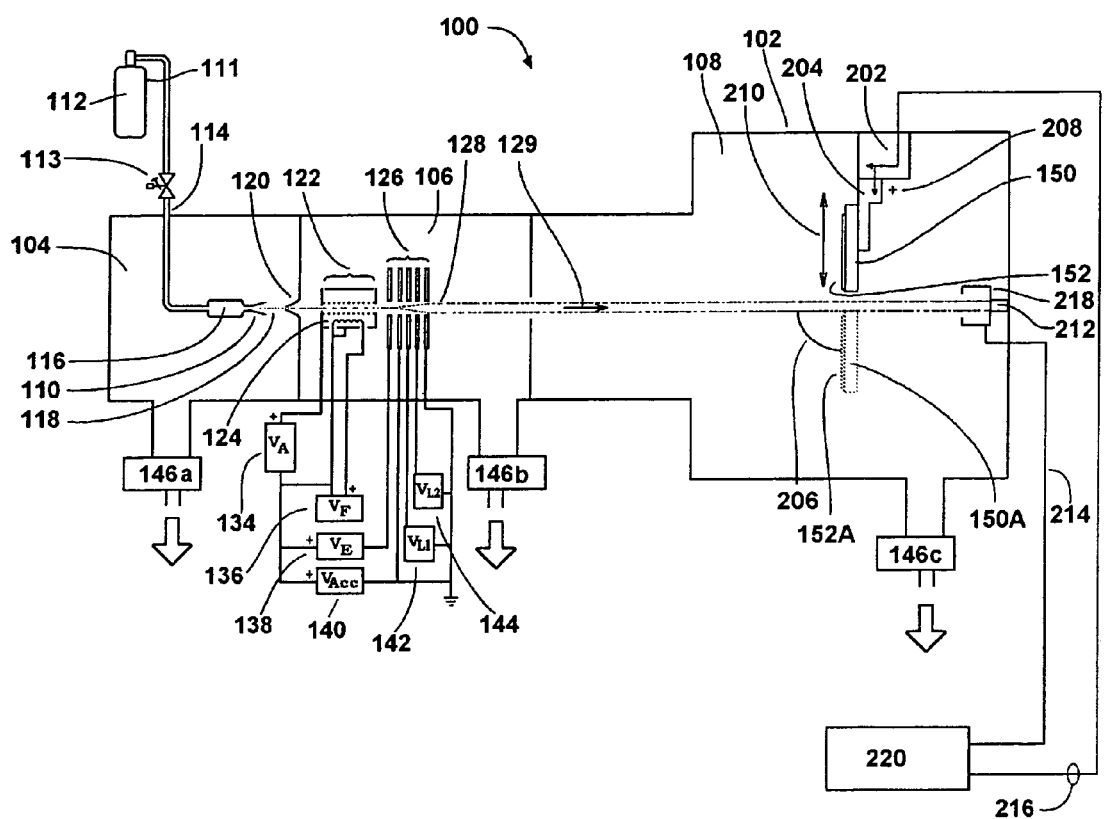
FIG. 1 is a schematic showing the basic elements of a prior art GCIB processing apparatus.

FIG. 1 shows a schematic of the basic elements of a typical configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas-jet 118 results. Cooling, which results from the expansion in the jet, causes a portion of the gas-jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases and/or gas mixtures.

After the supersonic gas-jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas-jet 118, where the jet passes through the ionizer 122. The electron impact ejects electrons from the clusters, causing a portion the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to 100 of kV or higher) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas-jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2:
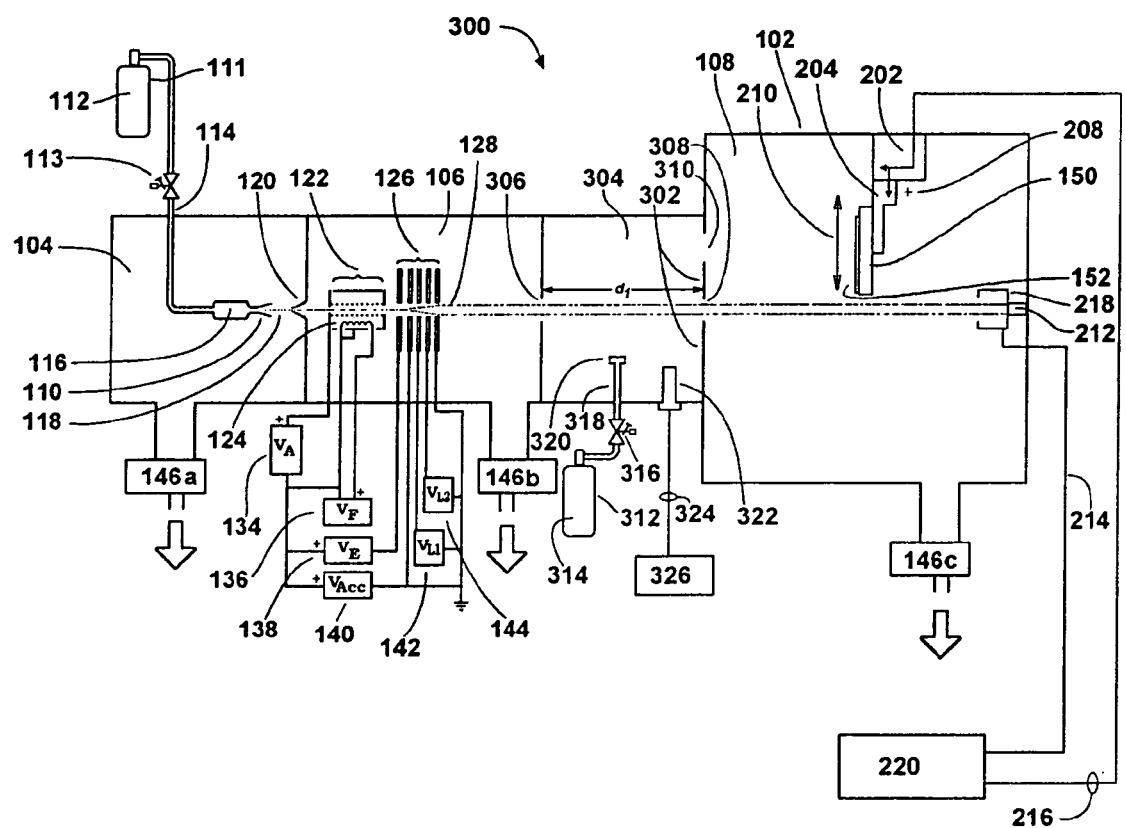
FIG. 2 shows a schematic of a GCIB processing apparatus 300 according to an embodiment of the present invention.

FIG. 2 shows a schematic of a GCIB processing apparatus 300 according to an embodiment of the present invention. A baffle 302 (multiple baffles may be used, but a single-baffle embodiment will be described for example and simplicity) creates a separate pressure chamber 304 that can be pressurized to a higher pressure than the pressure in the ionizing/acceleration chamber 106 and higher than the pressure in the processing chamber 108. The ionizing/acceleration chamber 106 has an ionizing/acceleration chamber aperture 306 through which the GCIB 128 enters the pressure chamber 304. Baffle 302 has a pressure chamber aperture 308 through which the GCIB 128 exits the pressure chamber 304. The path of the GCIB 128 through the pressure chamber 304 has a path length $d_1$, along a path $D_1$. Baffle 302 may have one or multiple openings 310 into the processing chamber 108. The pressure chamber aperture 308 and any additional openings 310 into the processing chamber 108 have a total combined gas conductance, $C_P$. The ionizing/acceleration chamber aperture 306 has a gas conductance $C_A$. A pressurized gas 314 is stored in gas storage cylinder 312. Pressurized gas 314 is preferably an inert gas, preferably argon. A gas metering valve 316 is preferably a mass-flow-control type metering valve and controls flow of pressurized gas 314 through gas feed tube 318 and diffuser 320 into the pressure chamber 304. Introducing gas 314 into the pressure chamber 304, increases the pressure in pressure chamber 304 relative to the base pressures in the ionizing/acceleration chamber 106 and the processing chamber 108.

Let:

$Q_{IN}$ represent the mass flow of gas into the pressure chamber 304 through the diffuser 320, $Q_A$ represents mass flow between the pressure chamber 304 and the ionizing/acceleration chamber 106 through the ionizing/acceleration chamber aperture 306, $Q_P$ represents mass flow between the pressure chamber 304 and the processing chamber 108 through the processing chamber aperture 308 and the openings 310, $P_C$ represents the vacuum pressure in the pressure chamber 304, $P_P$ represents the vacuum pressure in the processing chamber 108, which can be measured using a conventional vacuum gauge (not shown in FIG. 2), and $P_A$ represents the vacuum pressure in the ionizing/acceleration chamber 106, which can be measured using a conventional vacuum gauge (not shown in FIG. 2).

Then:

$$Q_{IN} = Q_A + Q_P \text{(conservation of mass)} \qquad \text{Eqn. 3}$$

$$Q_{IN} = (P_C - P_A)C_A + (P_C - P_P)C_P \qquad \text{Eqn. 4}$$

-continued $$P_C = \frac{Q_{IN} + P_A C_A + P_P C_P}{C_A + C_P} \qquad \text{Eqn. 5}$$

and for the case (preferred operating condition):

$P_C \gg P_P$ and $P_C \gg P_A$, then  Eqns. 6

$P_C \cong Q_{IN}/(C_A+C_P)$  Eqn. 7

Since the conductances $C_A$ and $C_P$ can be calculated or experimentally determined, and the $Q_{IN}$ is controlled by gas metering valve 316, preferably a mass flow control valve, and since $P_C$ and $P_A$ can be measured by using conventional vacuum pressure sensors, it follows that by using Eqn. 5 (or if conditions in Eqns. 6 are met, using Eqn. 7), $P_C$ is expressed in terms of known quantities and can be readily controlled by adjusting the gas metering valve 316. Alternatively and optionally, a pressure sensor 322 can be included in the pressure chamber 304. When present, the pressure sensor 322 is connected by cable 324 to pressure sensor controller and readout 326. Pressure controller and readout 326 directly reads out the pressure in pressure chamber 304.

In operation, pressure chamber 304 is operated at a pressure, $P_C$, greater than $P_A$ and greater than $P_P$. As GCIB 128 passes through pressure chamber 304 with elevated pressure, characteristics of the GCIB are modified in a way that improves its suitability for certain GCIB processing applications, as will be described hereinafter. The degree of modification of the GCIB characteristics is related to the pressure, $P_C$, and to the GCIB path length, $d_1$, in the pressure chamber 304. More specifically, when $P_C$ is approximately constant along the GCIB path, $D_1$, the degree of modification of the GCIB characteristics is related to the product of the pressure $P_C$ and the path length $d_1$, ($P_C \cdot d_1$). When the pressure $P_C$ in the pressure chamber has some spatial variation along the path, $D_1$, then the degree of modification of the GCIB characteristics is related to the integral from 0 to $d_1$, of ($P_C(x) \cdot dx$) taken along the path $D_1$ (the pressure-distance integral (PDI)). The pressure—path length product and/or the PDI can both be conveniently expressed in units of torr·cm.

Figure 3:
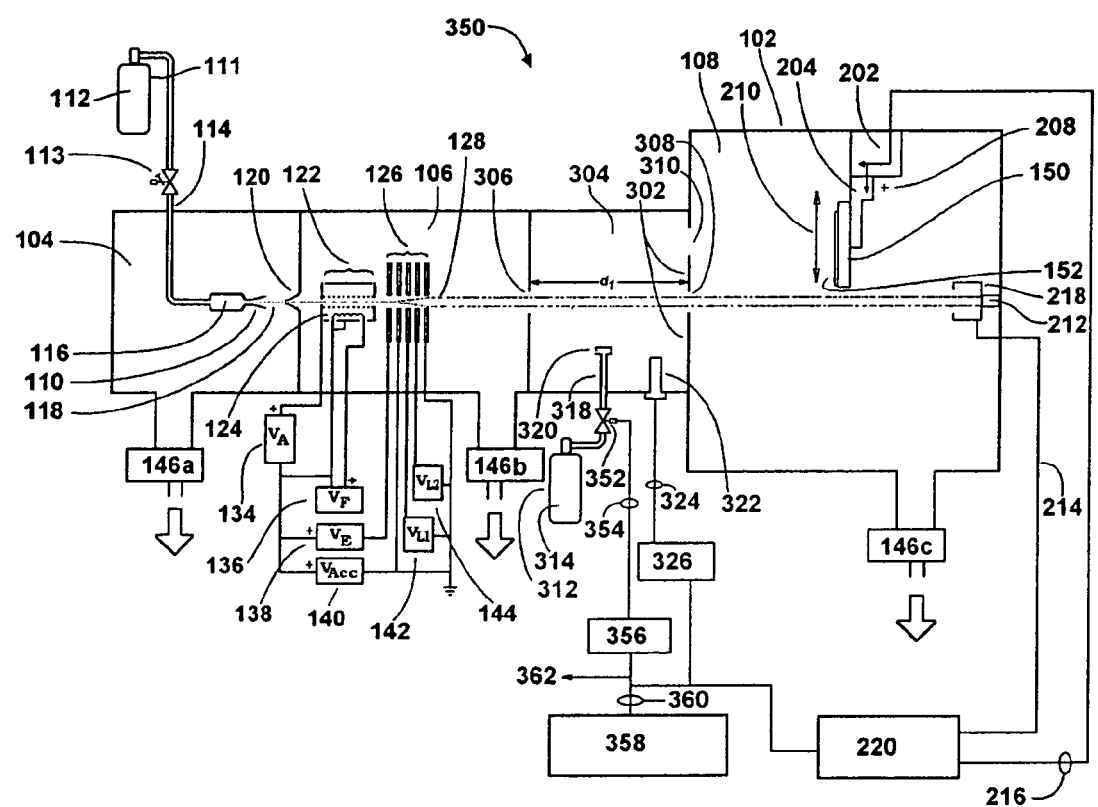
FIG. 3 is a schematic of a GCIB processing apparatus 350 according to a second embodiment of the present invention.

FIG. 3 shows a schematic of a GCIB processing apparatus 350 according to a second embodiment of the present invention. A pressurized gas 314 is stored in gas storage cylinder 312. Pressurized gas 314 is preferably an inert gas, preferably argon. A mass-flow-control valve 352 controls flow of pressurized gas 314 through gas feed tube 318 and diffuser 320 into the pressure chamber 304. A general purpose controller 358, which may be programmable and microprocessor based, and which may be a controller which is also used for control of all or a substantial portion of the GCIB processing apparatus 350, receives pressure measurement signals for the pressure in pressure chamber 304 from the pressure sensor 322 via cable 324, pressure sensor controller and readout 326, and cable 360. The controller 358 also controls the mass-flow-control valve 352 via cable 360, mass-flow-control valve controller 356, and cable 354 to set and regulate the flow of gas 314 into the pressure chamber 304. According to whether the pressure measurement signals from pressure sensor 322 are used or not used, controller 358 has capability to control the pressure $P_C$ in pressure chamber 304 by either open loop or by closed loop control algorithms. Controller 358 may also receive signals from other sensors and send control signals to other systems as part of a general control of the GCIB processing apparatus 350 via cable 360—these other connections are symbolized by the identifier 362.

Figure 4:
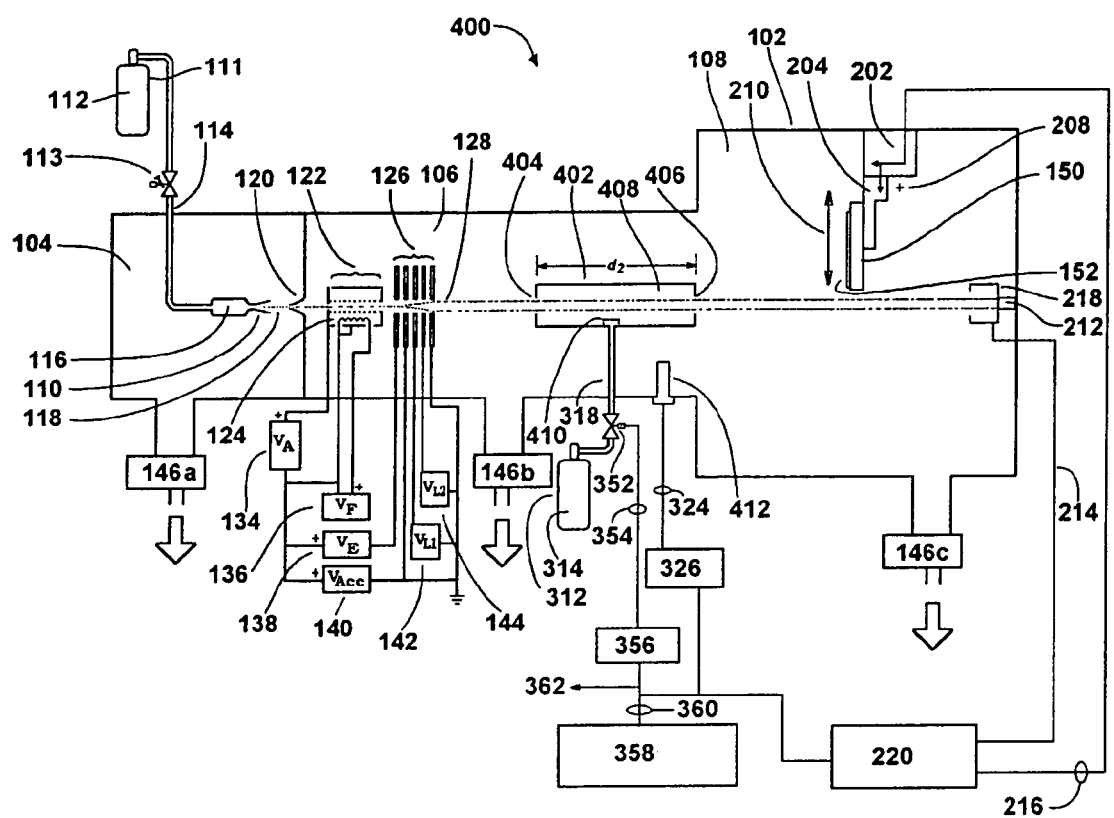
FIG. 4 is a schematic of a GCIB processing apparatus 400 according to a third embodiment of the present invention.

FIG. 4 shows a schematic of a GCIB processing apparatus 400 according to a third embodiment of the present invention. Ionizing/acceleration chamber 106 and processing chamber 108 communicate with each other and have substantially the same pressure, $P_{P2}$. A pressure cell 402 has a pressure cell interior 408 that can be pressurized to a pressure $P_{C2}$ that is typically a higher pressure than $P_{P2}$. The pressure cell 402 has a pressure cell entrance aperture 404 and a pressure cell exit aperture 406. GCIB 128 enters the pressure cell 402 through pressure cell entrance aperture 404 and exits the pressure cell 402 through pressure cell exit aperture 406. The path $D_2$ of the GCIB 128 through the pressure cell 402 has a path length $d_2$, along the GCIB path $D_2$. The pressure cell entrance aperture 404 and the pressure cell exit aperture 406 have a combined total gas conductance, $C_{P2}$. A pressurized gas 314 is stored in gas storage cylinder 312. Pressurized gas 314 is preferably an inert gas, preferably argon. A mass-flow-control valve 352 controls flow of pressurized gas 314 through gas feed tube 318 and diffuser 410 into the pressure cell 402. The general purpose controller 358, in this embodiment, which may also be programmable and microprocessor based, and which may be a controller which is also used for control of all or a substantial portion of the GCIB processing apparatus 400, receives pressure measurement signals for the pressure $P_{P2}$ from the pressure sensor 412 via cable 324, pressure sensor controller and readout 326, and cable 360. Controller 358 also controls the mass-flow-control valve 352 via cable 360, mass-flow-control valve controller 356, and cable 354 to set and regulate the flow of gas 314 into the pressure chamber 304. Depending upon whether the pressure measurement signals from pressure sensor 412 are used or not used, controller 358 has capability to control the pressure $P_{C2}$ in pressure cell 402 by either open loop or by closed loop control algorithms. It is pointed out that the invention can be practiced by application of Eqn. 12, and thus the ability to measure pressure $P_{P2}$ is not essential to practice of the invention. Controller 358 may also receive signals from other sensors and send control signals to other systems as part of a general control of the GCIB processing apparatus 350 via cable 360—these other connections are symbolized by the identifier 362.

Let:
$Q_{IN2}$ represent the mass flow of gas into the pressure cell 402 through the diffuser 410, $Q_{P2}$ represents mass flow between the pressure cell 402 and the processing chamber 108 and the ionizing/acceleration chamber 106 through the pressure cell entrance aperture 404 and the pressure cell exit aperture 406, $P_{C2}$ represents the vacuum pressure in the pressure cell 402, $P_{P2}$ represents the vacuum pressure in the processing chamber 108 and in the ionizing/acceleration chamber 106, which can be measured using pressure sensor 412.

Then $Q_{IN2}=Q_{P2}$ (conservation of mass)  Eqn. 8

$Q_{IN2}=(P_{C2}-P_{P2})C_{P2}$  Eqn. 9

$P_{C2}=(Q_{IN2}/C_{P2})+P_{P2}$  Eqn. 10 and for the case (preferred operating condition):

$P_{C2} \gg P_{P2}$, then  Eqn. 11

$P_{C2} \cong Q_{IN2}/C_{P2}$  Eqn. 12

Since the conductance $C_{P2}$ can be calculated or experimentally determined, and the $Q_{IN2}$ is controlled by mass-flow-control valve 352, and since $P_{P2}$ can be measured by using pressure sensor 412, it follows that by using Eqn. 10

(or if the conditions in Eqn. 11 is met, using Eqn. 12), $P_{C2}$ is expressed in terms of known quantities and can be readily controlled by adjusting the mass-flow-control valve 352.

In operation, pressure cell 402 is operated at a pressure greater than $P_{P2}$. As GCIB 128 passes through pressure cell 402 with elevated pressure, characteristics of the GCIB are modified in a way that improves its suitability for certain GCIB processing applications. The degree of modification of the GCIB characteristics is related to the pressure, $P_{C2}$, and to the GCIB path length, $d_2$, in the pressure cell 402. More specifically, when $P_{C2}$ is approximately constant along the GCIB path, $D_2$, the degree of modification of the GCIB characteristics is related to the product of the pressure $P_{C2}$ and the path length $d_2$, ($P_{C2} \cdot d_2$). When the pressure $P_{C2}$ in the pressure cell has some spatial variation along the path $D_2$, then the degree of modification of the GCIB characteristics is related to the integral from 0 to $d_1$, of $(P_{C2}(x) \cdot dx)$ taken along the path $D_2$ (the pressure-distance integral (PDI)). The pressure—path length product and/or the PDI can both be conveniently expressed in units of torr·cm.

Figure 5:
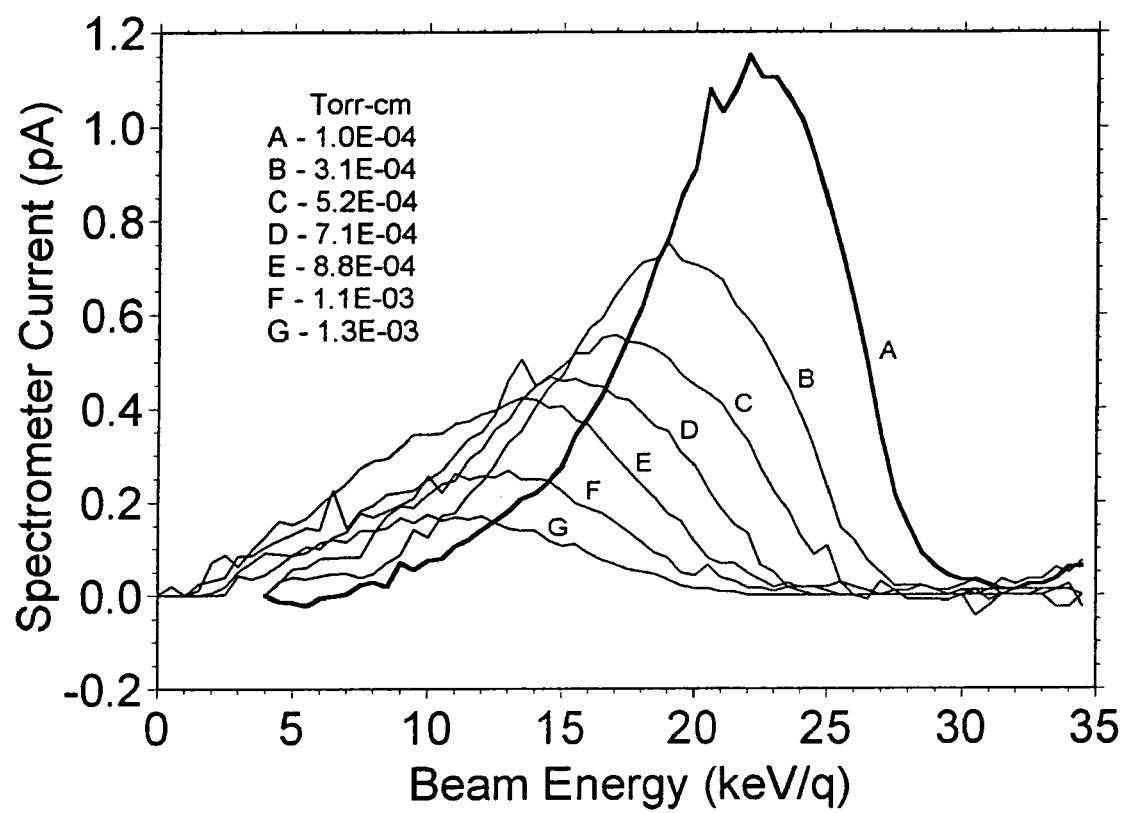
FIG. 5 is a graph showing results from measurement of GCIB characteristics after passing through a pressure cell under several pressure cell conditions.

FIG. 5 is a graph showing results from measurement of GCIB characteristics after passing through a pressure cell under several pressure cell conditions (cases A through G). The original GCIB was an argon gas-cluster ion beam accelerated through a 30 kV potential difference. The graph plots the distribution of gas-cluster ion frequency (ordinate, arbitrary units) versus gas-cluster ion energy per charge (abscissa, keV/q). Cases A through G are for pressure cell PDI values of from $1.0 \times 10^{-4}$ torr-cm to $1.3 \times 10^{-3}$ torr-cm. The case A, $1.0 \times 10^{-4}$ torr-cm, is substantially equivalent to the case where there is no pressure cell and shows a gas-cluster ion energy distribution that is narrow and peaked at approximately 22 keV/q. With increasing PDI values, the distributions broaden and the peak of the energy distribution moves to lower values. These modified distributions generally cannot be duplicated by simply lowering the beam accelerating potential (without the use of the invention). The distributions resulting from larger PDI values provide superior GCIB smoothing performance, but lower etching rates.

Figure 6:
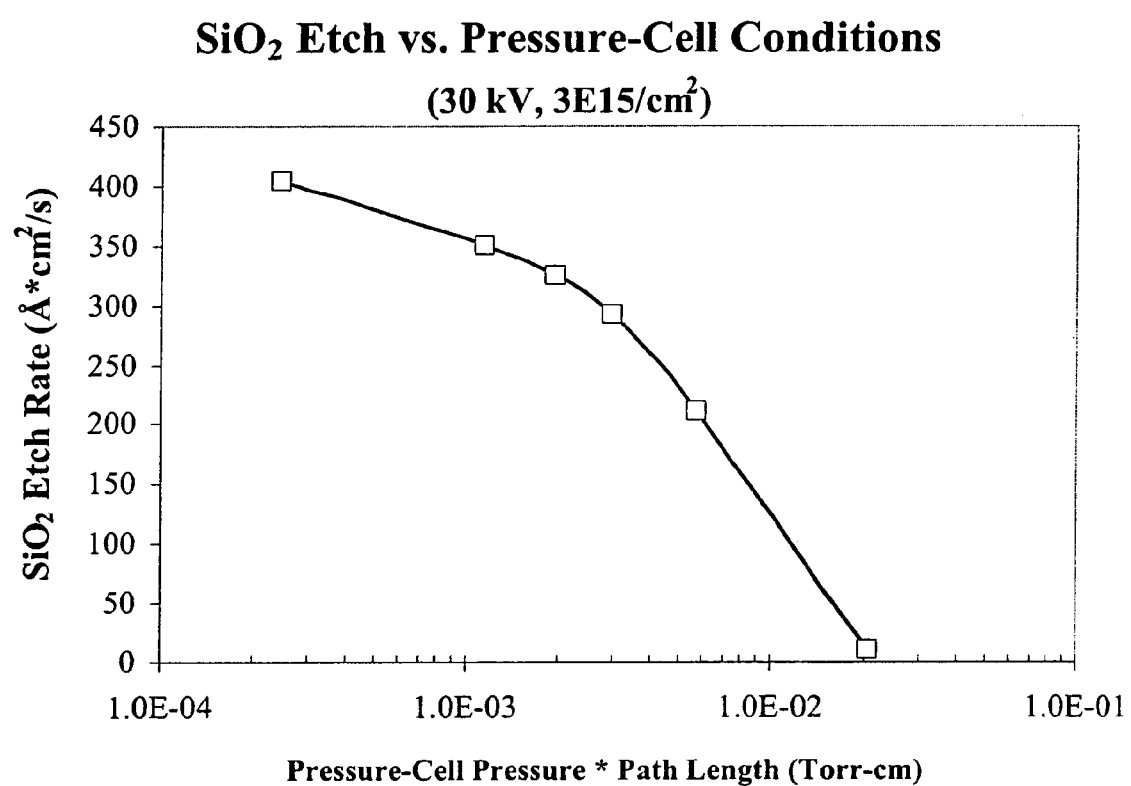
FIG. 6 is a graph showing dependence of GCIB etching rate on PDI (pressure-distance integral) value.

FIG. 6 is a graph showing dependence of GCIB etching rate on PDI value. In the case illustrated, workpieces having an $SiO_2$ surface were processed by an argon GCIB accelerated by an acceleration potential of 30 kV and irradiated to a total dose of $3 \times 10^{15}$ gas-cluster ions/cm$^2$. It is seen that at low PDI values, etch rate drops slowly with increasing PDI values, but at high PDI values etch rate drops more rapidly and approaches zero.

Figure 7:
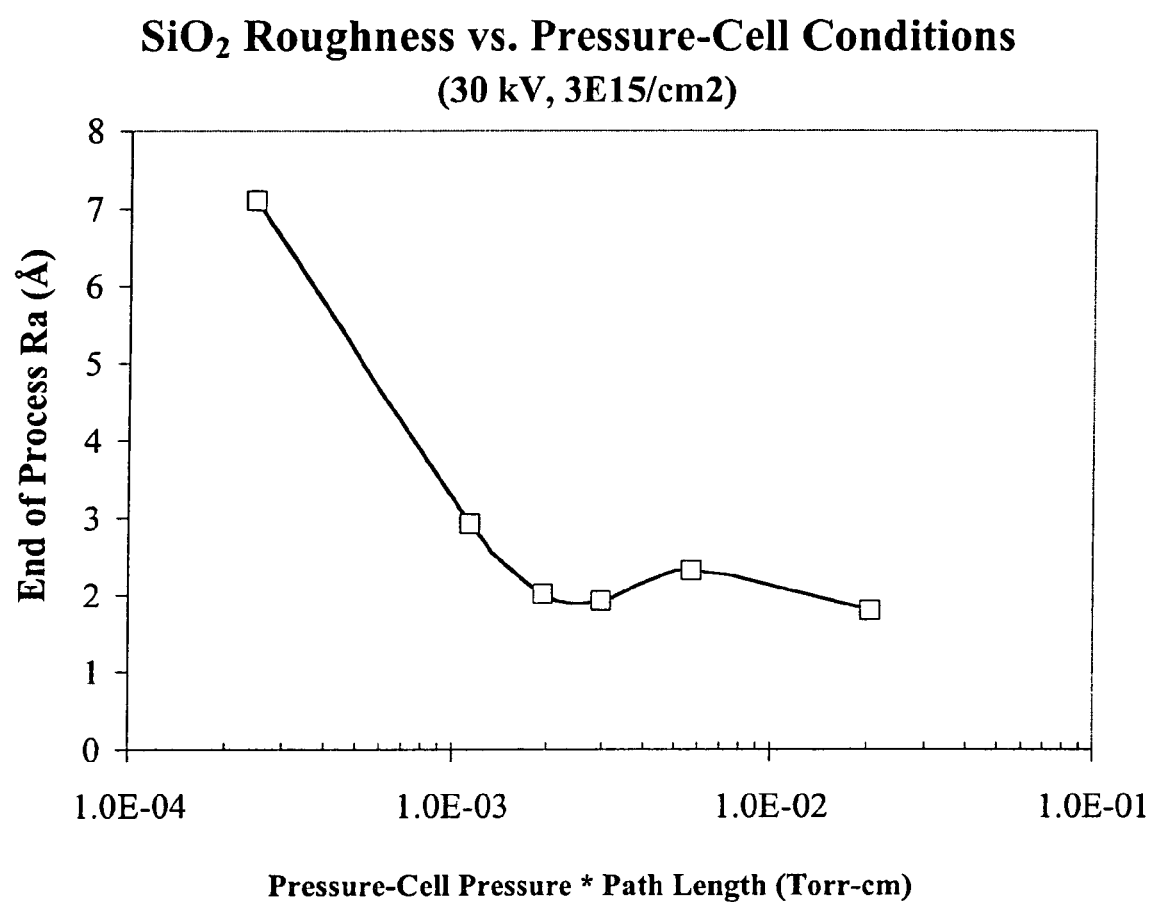
FIG. 7 is a graph showing dependence of final (end of process) surface roughness on PDI value, as measured by atomic force microscope.

FIG. 7 is a graph showing dependence of final (end of process) surface roughness on PDI value, as measured by atomic force microscope. In the case illustrated, workpieces having an $SiO_2$ surface were processed by an argon GCIB accelerated by an acceleration potential of 30 kV and irradiated to a total dose of $3 \times 10^{15}$ gas-cluster ions/cm$^2$. It is seen that at low PDI values, end-of-process roughness drops rapidly with increasing PDI value, but at high PDI values, end-of-process roughness reaches a low value that does not improve further.

FIGS. 6 and 7 show data for etching and smoothing of $SiO_2$. However similar results have been obtained for a variety of workpiece materials, including metals, oxides, ceramics, and semiconductors, and the behavior is similar. For PDI (or pressure—path length products) greater than $5 \times 10^{-4}$ torr-cm, significant smoothing (and/or freedom from roughening) is achieved with minor reduction of etching rate. The combination of high etch rate with similarly good smoothing and/or freedom from roughening is often not obtainable by conventional ways of adjusting the GCIB source or adjusting the acceleration potential. With increasing PDI values, superior smoothing results are obtained but at progressively lower etching rates. At high PDI values, many materials are smoothed to levels not obtained by conventional ways of adjusting the GCIB source.

Although the invention has been described with respect to various embodiments, it should be realized this invention is also capable of a wide variety of further and other embodiments within the spirit of the invention.

It is claimed:

1. An apparatus for generating a gas-cluster ion beam with a modified gas-cluster ion energy distribution, comprising:
    a reduced-pressure chamber having a reduced-pressure;
    a gas-cluster ion beam source within the chamber, for generating an energetic gas-cluster ion beam having a gas-cluster ion beam path; and
    a pressure-controlled region within the reduced-pressure chamber having an average pressure greater than the reduced-pressure;
    wherein at least a portion of the gas-cluster ion beam path traverses the pressure-controlled region so as to be modified by the greater pressure of the pressure-controlled region.

2. The apparatus of claim 1, wherein the gas-cluster ion beam source further comprises:
    a pressurized gas source;
    a nozzle for expanding pressurized gas from the pressurized gas source into the reduced-pressure chamber to form gas-clusters;
    an ionizer for ionizing the gas-clusters to form a gas-cluster ion beam; and
    an accelerator for accelerating the gas-cluster ion beam to form the energetic gas-cluster ion beam.

3. The apparatus of claim 1, wherein the portion of the gas-cluster ion beam path that traverses the pressure-controlled region has a pressure-distance integral along the path within the pressure-controlled region that is greater than about $5 \times 10^{-4}$ torr-cm.

4. The apparatus of claim 1, further comprising a control system for controlling the average pressure in the pressure-controlled region.

5. The apparatus of claim 1, wherein the energetic gas-cluster ion beam comprises gas-cluster ions, at least a fraction of which are multiply ionized.

6. The apparatus of claim 4, wherein the pressure-controlled region comprises a region within a pressure chamber.

7. The apparatus of claim 1, wherein:
    the reduced-pressure chamber further comprises an ionizing/acceleration chamber including the gas-cluster ion beam source;
    the pressure-controlled region comprises a pressure chamber; and
    the pressure chamber has a higher pressure than the ionizing/acceleration chamber.

8. The apparatus of claim 7, wherein:
    the reduced-pressure chamber further comprises a processing chamber; and
    the pressure chamber has a higher pressure than the processing chamber.

9. The apparatus of claim 1, wherein the pressure-controlled region comprises a region within a pressure cell.

10. The apparatus of claim 9, wherein the gas-cluster ion beam source further comprises:
   an ionizer for ionizing said gas-clusters to form a gas-cluster ion beam; and
   an accelerator for accelerating said gas-cluster ion beam to form an energetic gas-cluster ion beam.

11. The apparatus of claim 9, further comprising a control system for controlling a pressure in the pressure cell.

12. The apparatus of claim 9, wherein the energetic gas-cluster ion beam comprises gas-cluster ions, at least a fraction of which are multiply ionized.

13. The apparatus of claim 9, wherein the pressure cell has a higher pressure than the reduced-pressure chamber.

14. A method of processing a workpiece with a gas-cluster ion beam, comprising the steps of:
   generating a gas-cluster ion beam with a gas-cluster ion beam source within a reduced-pressure chamber;
   accelerating via an accelerator the gas-cluster ion beam to form an energetic gas-cluster ion beam having a beam path;
   holding a workpiece within the reduced-pressure chamber;
   providing an increased-pressure region between the accelerator and the workpiece, wherein at least a portion of the beam path traverses the increased-pressure region.

15. The method of claim 14, wherein the generating step further comprises:
   providing a pressurized gas source;
   providing a nozzle
   flowing pressurized gas through said nozzle for expanding the gas from said pressurized gas source into said reduced-pressure chamber to form gas-clusters;
   providing an ionizer; and
   ionizing said gas-clusters to form the gas-cluster ion beam.

16. The method of claim 14, further comprising the steps of:
   providing a control system for controlling a pressure in the increased-pressure region; and
   controlling a pressure in the increased-pressure region with the control system.

17. The method of claim 14, wherein the at least a portion of the beam path that traverses the increased-pressure region has a pressure-distance integral along the path within the increased-pressure region that is greater than about $5 \times 10^{-4}$ torr-cm.

18. The method of claim 14, wherein the energetic gas-cluster ion beam comprises gas-cluster ions, at least a fraction of which are multiply ionized.

19. A method of modifying the gas-cluster ion energy distribution in an accelerated gas-cluster ion beam comprising the steps of:
   generating a gas-cluster ion beam with a gas-cluster ion beam source within a reduced-pressure chamber;
   accelerating with an accelerator within the reduced-pressure chamber the gas-cluster ion beam to form an energetic gas-cluster ion beam having a beam path and a gas-cluster ion energy distribution;
   providing an increased-pressure region in the reduced-pressure chamber;
   directing the energetic gas-cluster ion beam path so as to traverse the increased-pressure region with at least a portion of the gas-cluster ion beam path, producing a gas-cluster ion beam with a modified gas-cluster ion energy distribution.

20. The method of claim 19, wherein the at least a portion of the gas-cluster ion beam path that traverses the increased-pressure region has a pressure-distance integral along the path within the increased-pressure region that is greater than about $5 \times 10^{-4}$ torr-cm.

21. The method of claim 19, further comprising the steps of:
   providing a control system for controlling a pressure in the increased-pressure region; and
   controlling a pressure in the increased-pressure region.

22. The method of claim 21, wherein the controlling step controls a pressure within the increased-pressure region such that the pressure-distance integral along the path is greater than about $5 \times 10^{-4}$ torr-cm.

23. The method of claim 19, wherein the energetic gas-cluster ion beam comprises gas-cluster ions, at least a fraction of which are multiply ionized.

* * * * *